(12) United States Patent
Ruske et al.

(10) Patent No.: US 9,985,239 B2
(45) Date of Patent: May 29, 2018

(54) OLED DEVICE AND METHOD OF PRODUCING AN OLED DEVICE

(71) Applicant: KONINKLIJKE PHILIPS N.V., Eindhoven (NL)

(72) Inventors: Manfred Stephan Ruske, Kerpen (DE); Holger Schwab, Aachen (DE); Herbert Lifka, Eindhoven (NL)

(73) Assignee: Koninklike Philips N.V., Eindhoven (NL)

( * ) Notice: Subject to any disclaimer, the term of this patent is extended or adjusted under 35 U.S.C. 154(b) by 0 days. days.

(21) Appl. No.: 14/354,445

(22) PCT Filed: Oct. 22, 2012

(86) PCT No.: PCT/IB2012/055797
§ 371 (c)(1),
(2) Date: Apr. 25, 2014

(87) PCT Pub. No.: WO2013/061237
PCT Pub. Date: May 2, 2013

(65) Prior Publication Data
US 2014/0299866 A1   Oct. 9, 2014

Related U.S. Application Data

(60) Provisional application No. 61/552,830, filed on Oct. 28, 2011.

(30) Foreign Application Priority Data

Oct. 22, 2012 (WO) .................. PCT/IB2012/055797

(51) Int. Cl.
H01L 51/52     (2006.01)
H01L 27/32     (2006.01)
H01L 51/56     (2006.01)

(52) U.S. Cl.
CPC ...... *H01L 51/5231* (2013.01); *H01L 27/3239* (2013.01); *H01L 51/5225* (2013.01); *H01L 51/56* (2013.01); *H01L 2251/5323* (2013.01)

(58) Field of Classification Search
CPC ... H01L 27/32–27/326; H01L 51/50–51/5287;
(Continued)

(56) References Cited

U.S. PATENT DOCUMENTS 6,501,218 B1   12/2002   Duggal
8,310,149 B2   11/2012   Lifka et al.
(Continued)

FOREIGN PATENT DOCUMENTS

CN   201936883 U   8/2011
JP   08259938      8/1996
(Continued)

*Primary Examiner* — Cuong B Nguyen

(57) ABSTRACT

The invention describes an OLED device (1) comprising an organic layer (3) which emits light ($L_1$) in operation and which is positioned between an essentially transparent anode layer (5) and an essentially opaque cathode layer (7). The cathode layer (7) is deliberately structured along a main extension plane (EP) of the OLED device to comprise at least one cathode region (11, 11a, 11b) in which the cathode layer (7) is 10 present and a plurality of cathode-free regions (13, 13a, 13b) and/or at least one cathode-free region (13, 13a, 13b) of a larger extension, through which cathode-free regions and/or region (13, 13a, 13b) visible light ($L_2$) can pass in the direction of a cross extension (CE) of the OLED device. The invention also describes a production method of such OLED device (1).

18 Claims, 4 Drawing Sheets

(58) Field of Classification Search
CPC ................... H01L 2227/32–2227/326; H01L 2251/5323–2251/5361; H01L 2924/12044
See application file for complete search history.

(56) References Cited

U.S. PATENT DOCUMENTS

| | | |
|---|---|---|
| 2001/0026123 A1 | 10/2001 | Yoneda |
| 2006/0024855 A1* | 2/2006 | Sano ............................... 438/34 |
| 2008/0238304 A1 | 10/2008 | Schmid et al. |
| 2010/0314616 A1 | 12/2010 | Kodama et al. |
| 2011/0193477 A1 | 8/2011 | Lifka et al. |
| 2011/0215712 A1 | 9/2011 | Hong |
| 2011/0220899 A1 | 9/2011 | Park et al. |
| 2011/0310543 A1* | 12/2011 | Kim .................. G02F 1/133308 361/679.01 |
| 2012/0018770 A1* | 1/2012 | Lu et al. ......................... 257/99 |
| 2012/0075185 A1* | 3/2012 | Brug .................. H01L 27/3251 345/163 |

FOREIGN PATENT DOCUMENTS

| | | | | |
|---|---|---|---|---|
| JP | 2001035669 A | * | 2/2001 | ......... H01L 27/3239 |
| JP | 2006003698 | | 1/2006 | |
| JP | 2011134707 A | | 7/2011 | |
| WO | 0070639 | | 11/2000 | |
| WO | 0124586 A1 | | 4/2001 | |
| WO | 2011073856 A1 | | 6/2011 | |

\* cited by examiner

OLED DEVICE AND METHOD OF PRODUCING AN OLED DEVICE

FIELD OF THE INVENTION

The invention describes an OLED device comprising an organic layer which emits light in operation and which is positioned between an essentially transparent anode layer and an essentially opaque cathode layer. It also describes a method of producing such device.

BACKGROUND OF THE INVENTION

OLED devices, i.e. organic LED devices are area light sources in contrast to normal LEDs, which can be generally described as point light sources rather than area light sources. One feature which can be realized using OLED technologies is to have an area light source which is transparent in the off-state.

The state of the art concepts for transparent or partially transparent OLEDs are based on the use of thin, low absorbing cathodes. In other words, the cathode is made of transparent or translucent material. As the anode and also the organic layer of the OLED device are transparent as well, the complete OLED device is generally transparent. In this context it may generally be noted that the term "transparent" is used throughout this application also as a synonym for "translucent". "Essentially transparent" is generally defined to be a state of a particular layer or device in which light within the visible frequency range can pass through with a loss of less than 80%, preferably 50%, most preferred 20%. Thus, "essentially opaque", which is the opposite of "essentially transparent", is always reached when light is absorbed at a ratio of at least 80%. "Layer" throughout this description can comprise a single integral layer, but also a stack of layers, in particular with reference to the organic layer.

For instance, US 2011/0193477 A1 discloses such an OLED device with an organic light-emitting layer between a transparent anode and a transparent cathode. In addition, at that side of the cathode facing away from the organic layer a structured mirror layer is disposed.

In order to realize a transparent cathode, often silver-based cathodes are used. One disadvantage connected with such thin silver layers is that they suffer from reliability problems. In addition, silver is a costly and comparatively rare material. Other materials such as so-called TCOs, i.e. transparent conductive oxides such as ITO (indium tin oxide), can also be used theoretically, however, the organic layer which emits the light can easily be damaged during the deposition and/or curing of such layers.

Therefore, it is an object of the invention to provide an alternative solution of how to realize an OLED device which is transparent for at least some ambient light to pass through and easy to both produce and to maintain at the same time.

SUMMARY OF THE INVENTION

The object of the invention is achieved by the OLED device according to claim 1 and by the method according to claim 11.

According to the invention, the OLED device of the above-mentioned kind comprises a cathode layer which is deliberately structured along a main extension plane of the OLED device to comprise at least one cathode region in which the cathode layer is present and
  a plurality of cathode-free regions and/or
  at least one cathode-free region of a larger extension,
  through which cathode-free regions and/or region visible light can pass in the direction of a cross extension of the OLED device.

What is described is thus a partially transparent OLED device with a main extension plane along which the cathode layer is structured and is thus divided into opaque regions and transparent regions. Thereby, it may be noted that the expression "plane" does not necessarily refer to a completely flat extension of a plane but can also imply a curved plane. The cathode layer, the organic layer and the anode layer are arranged above each other, which means that they are arranged along the cross extension of the OLED device.

By structuring the cathode layer deliberately, i.e. intentionally at certain predefined places, a structure of the cathode layer is achieved which, according to a first possibility, comprises a plurality of cathode-free regions, i.e. of openings or holes which let light, in particular light in the humanly visible frequency range, pass through the complete OLED device. A similar effect can be achieved as in the above-mentioned US 2011/0193477 A1, however with a reduction of layers (no extra layer is needed in order to provide an opaque reflective structure) and with less complicated cathode materials. The optic result, however, can be very similar: during operation of the OLED device, no light emission takes place between the cathode-free regions and the anode. Light is only emitted in the direction of the anode, except for minor scattering effects. The more cathode-free regions, the higher is the overall transparency of the OLED device, but also the less light can be emitted during operation.

According to a second possibility, which is an alternative or an additional solution, there is supplied at least one cathode-free region of a larger extension. Thereby, a "larger extension" is defined to comprise at least 5% of the overall area of the main extension plane of the OLED device, preferably at least 10% and most preferred at least 20%. Both possibilities provide for an OLED device through which ambient light can easily pass through from one surface to the other. For such OLED device, other materials than silver or TCOs can be used for realizing the cathode. This means that also well-known and rather cheap materials such as aluminium films can be used, which has the potential of using less complicated materials both with respect to application and maintenance.

In this context, it may be noted, that an OLED device can generally be divided into a display region and into a non-display region. For instance, all those regions along the main extension plane of an OLED device which serve as contacting areas do not function as display regions. In contrast, a display region is that a region of the OLED device which intentionally serves to be displayed to an observer, and which is preferably defined by the boundaries of the area inside of which light is emitted by activating the organic layer.

According to the invention, a method of the above-mentioned kind includes a step in which the cathode layer is deliberately structured along a main extension plane of the OLED device to comprise at least one cathode region in which the cathode layer is present and
  a plurality of cathode-free regions and/or
  at least one cathode-free region of a larger extension,
  through which cathode-free regions and/or region visible light can pass in the direction of a cross extension of the OLED device.

The result of this method is an OLED device according to the invention. A particular advantage of using the method according to the invention lies in the fact that standard materials can be used as a cathode layer, these standard materials usually being opaque, whilst a partially transparent OLED device can be realized nevertheless without extensive extra effort. This will be shown in the context of the embodiments according to the sub claims.

Such OLED device is preferably applied to a window pane. In such case, in dependence of the position of a designated observer, the anode layer and the cathode layer can be directed into different directions. It is thereby preferred that a window pane with a first surface directed in an observer direction towards a designated observer and with a second surface directed in the opposite direction, i.e. away from the designated observer, comprises an OLED device according to the invention wherein the cathode is arranged to face in the opposite direction and the anode layer is arranged to face in the observer direction. Such an OLED device can be applied e.g. to window pane where the observer is situated inside a room so that the OLED device lights the room for instance in times of darkness while reducing the incoming light during daylight.

The dependent claims and the following description disclose particularly advantageous embodiments and features of the invention. Features of the embodiments may be combined as appropriate. Features described in the context of one claim category can apply equally to another claim category.

According to a first embodiment of the invention the OLED device comprises a pattern of cathode-free regions. This in return implies that it also comprises a pattern of cathode regions, whereby preferably at least one cathode-free region is surrounded by a cathode region. Such pattern can be both regular and irregular, depending in particular on the context of the application of the OLED device. A pattern can be realized for example by using equal sizes and/or shapes of cathode-free regions. The same applies for cathode regions. In particular, it is preferred that the pattern is a repetitive pattern with respect to at least one direction along the main extension plane. That means that the same pattern structure can be found several times along at least this one direction, preferably in both directions. Most preferred is a pattern in which the succession of cathode free regions and cathode regions is continuously the same, in particular in both directions. For instance, a grid pattern can be used or a pattern of rectangular or round cathode-free regions and/or cathode regions, whereby the respective regions are aligned at an equal distance from each other in both directions of the main extension plane of the OLED device.

According to a second embodiment which can be used alternatively or in addition to the first embodiment, the cathode region is structured to form a depiction of a figurative element. Such figurative element can comprise a code such as a letter or a number as well as a symbol, but it may also comprise an illustrative element which may be, but need not necessarily be, a kind of encoded picture or symbol. As OLED devices can be used for purposes of advertisement or design, a figurative element may in particular contain design elements or the like. That means that not only the colours and light of the OLED device in operation may constitute a picture or a depiction but also the shape of the cathode region in a switch-off state so that this provides for an extra illustrative effect. A figurative element can be realized for instance by shaping one or several cathode regions such that they build the figurative element. However, it can also be realized by a different pattern of cathode-free regions and cathode regions within another such pattern so that the region with the different pattern appears to constitute a figurative element of its own. For example, if the cathode-free regions such as holes within a pattern are smaller in a selected area of a figurative element than in another area, the effect is that the selected area of the figurative element appears to be this figurative element. The same applies if such cathode-free regions are smaller in a selected area than in another area.

Preferably, the transparent anode layer is applied to a transparent substrate such as glass or transparent plastic. This provides for an extra stability of the overall OLED and also helps to insulate the transparent anode layer (and the layers above it) from the environment, therefore providing protection against moisture or other influences which might damage the anode layer as well as the organic layer and even the cathode layer.

It is further preferred that the cathode layer is realized to reflect light coming from the side of the organic layer. This helps to focus the light which is emitted by the organic layer into one direction, namely into the direction facing away from the cathode layer, so that more light is emitted via the anode layer in the direction of an observer. Generally, an OLED device according to the invention is realized such that light is essentially only emitted through the anode layer—with maybe little light scattering effects which provide for a certain emission of light through the cathode-free regions. This scattering effect can further be reduced by a reflecting cathode layer. In addition, a mirror effect of the cathode layer in this context is particularly wishful because it also gives the overall impression of the OLED the appearance of a design element even if it is not in operation. Because the cathode layer is structured into different regions, such mirroring cathode layer can be used as a design element the design effect of which is enhanced by the mirror effect.

In particular, materials which can be used for realizing the cathode layer include metals, for instance aluminium or silver. It must be noted in this context, that to reach opacity with silver, a thicker layer needs to be used than in the above-mentioned state of the art. Silver layers according to the state of the art have a thickness of about 10 nm in order to provide for a sufficient transparency; thus opaque silver layers as used in the context of the invention have a significantly greater thickness, as will be outlined below. Opaque silver layers have the advantage of good reflective properties, which makes them advantageous for some applications. On the other hand, aluminium films or other metal films than silver can often be provided at lower costs and with less effort. It may be noted that the expression "film" need not necessarily refer to a unit such as a foil which is prefabricated and then disposed on other layers of the OLED device. Rather, often films are disposed on other layers by vapour deposition, sometimes also by sputtering.

In order to achieve the desired opacity of the cathode layer it is preferred that the cathode layer in the cathode region has a thickness of at least 50 nm, preferably at least 80 nm, most preferred at least 100 nm. Most preferred the cathode layer is formed, as mentioned above from a film which can be applied to the organic layer as an integral piece and structured when situated above the organic layer.

One advantage of the OLED device according to the invention is that the opacity also implies a certain minimum amount of atoms in the cross extension of the cathode layer. Thus, relatively low impedances can be reached. It is thus preferred that the cathode layer has a sheet resistance of not more than 3 $\Omega$/square, preferably not more than 1.5 $\Omega$/square, preferably not more than 1 $\Omega$/square. This can be realised by a suitable selection of material in combination with an according material thickness.

A basic structure of the OLED device according to the invention is such that the cathode layer only needs to be contacted in one particular spot in order to be operated as a cathode layer along the whole plane of the OLED device. For that purpose it is preferred that the OLED device comprises exactly one single cathode region or a plurality of cathode regions at least two of which, preferably all, are interconnected by a conductive material. This means that there is definitely a galvanic interconnection within the cathode layer. If the OLED device only comprises one integral single cathode region it is clear that this region can be contacted at any spot where it is present. A similar effect can be realized by interconnecting separate cathode regions, for instance on the level of the cathode layer. That interconnection can be realized for example by locally applying a transparent conductive material such as silver between the separate cathode regions. The method according to the invention can thus be enhanced by interconnecting at least two cathode regions by a locally applied transparent conductive material. A local application means of the transparent conductive material means that the transparent conductive material is only selectively applied along the main extension plane of the OLED device, in particular of the display region.

Generally, but in particular in applications of window panes as mentioned above, at particular embodiment of the OLED device according to the invention is such that the cathode-free regions are realized according to a minimum resolution achievable by an eye of an observer at a predefined position relative to the OLED device. Thereby it is preferred, that the shape and/or size of the cathode free regions and/or their distance from each other is such that the minimum resolution is insufficient for the observer at the predefined position, so that a kind of a blurr effect occurs. For instance, if the OLED device's cathode layer contains small round holes as cathode-free regions, the size of these holes and their distance from each other would then be such that when the OLED device is in operation, an observer cannot distinguish between the cathode region and the cathode-free regions and thus sees only a light-emitting plane instead. In contrast, a similar effect can also be achieved by the contrary: by reducing the size of the cathode regions and/or by shaping them accordingly and/or by arranging their distances from each other accordingly a similar blurr effect can be achieved with respect to ambient light.

One method of structuring the cathode layer is by applying it only locally instead of as an integral layer. With that method for instance line patterns can be realized. It is preferred, however, that the cathode layer is structured by partially removing it. This is a particularly easy method of how to structure the cathode layer effectively, because the cathode layer at first can be applied in one part or as one layer and the structuring is then a decisive process of selection later on. In addition, the cathode resistance can be lower this way. In this context one possibility of partially removing the cathode layer is that by means of laser ablation. This standard method, which implies well-established processes provides for a simple and comparatively fast method of very effective removal only in the desired regions. However, in some cases it may be wished that the removal of the cathode layer is done in such way that no debris is produced. Debris can be a potential danger with regard to short circuiting and/or thin film encapsulation. Therefore another possibility of partially removing the cathode layer is by means of etching, preferably by plasma etching. The areas which are to be removed can be defined with an etching mask, for instance made of a resist deposited via spin or slit coating with subsequent photolithography or by inkjet printing.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
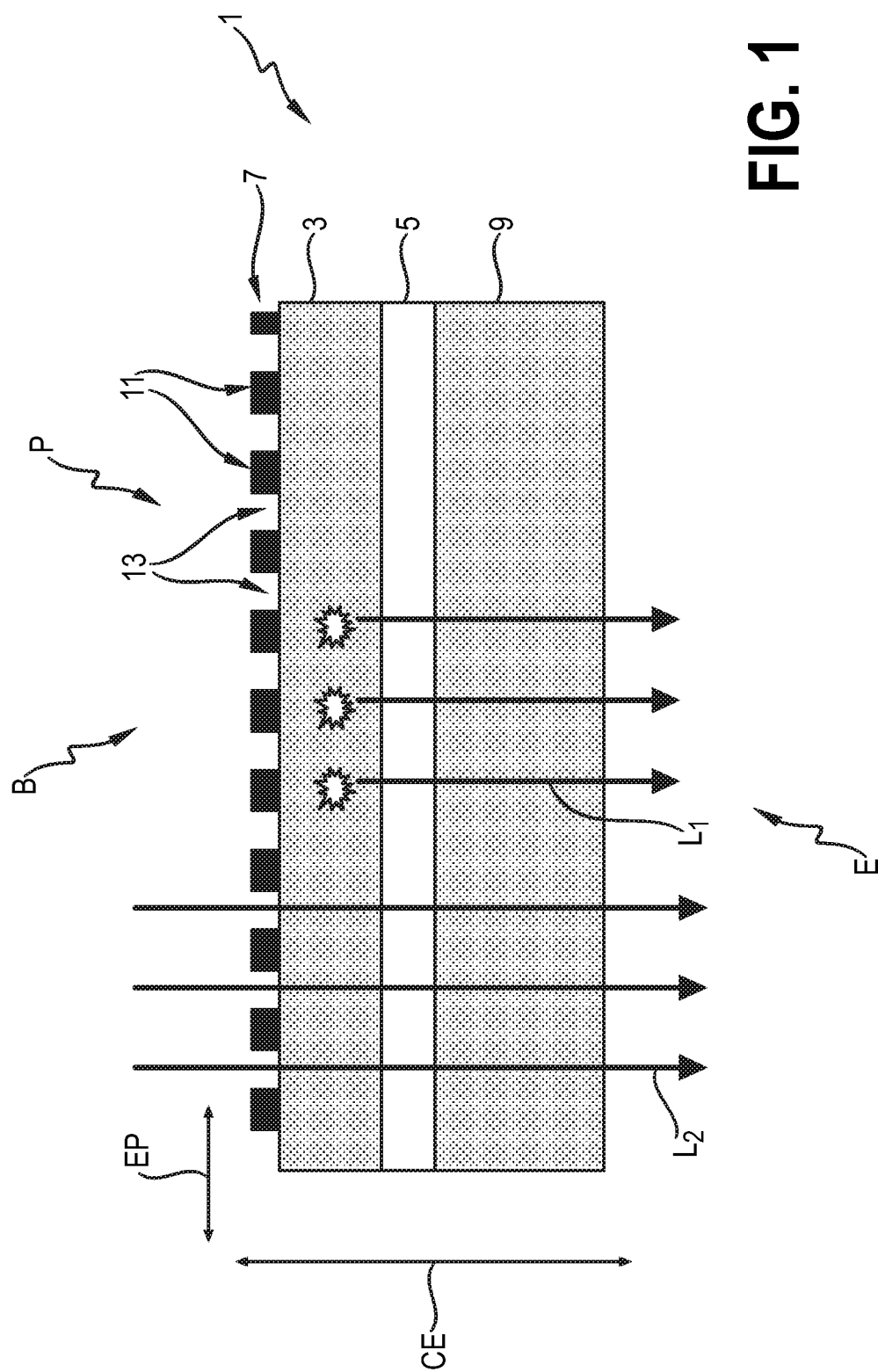
FIG. 1 shows a section view of an embodiment of an OLED device according to the invention.

FIG. 1 shows an OLED device 1 comprising from bottom to top (i.e. along the cross extension CE of the OLED device) a transparent glass substrate 9, a transparent anode layer 5, an organic layer 3 which emits light $L_1$ in operation and a cathode layer 7. The cathode layer 7 is structured in such way that there are both cathode regions 11 where the cathode layer 7 is present and cathode-free regions 13 were no cathode layer 7 is present. These cathode regions 11 and cathode-free regions 13 are aligned along a main extension plain EP of the OLED device 1. The structured cathode layer 7 has been realized by local laser ablation of an opaque aluminium film so that the aluminium has essentially completely vanished in the cathode-free regions. The cathode regions 11 and the cathode-free regions 13 make up a pattern P, which is a regular and repetitive pattern P.

This particular construction of an OLED device has several effects: firstly, the OLED device only has one emission surface E, namely the surface facing away from the cathode layer 7. For that purpose the cathode layer 7 is such that light emitted by the organic layer 3 in operation is mirrored and thus exits the OLED device in the direction of the emission surface E. Secondly, ambient light $L_2$ can pass through the OLED device from a back surface B opposite of the emission surface E and also vice versa. This provides for a partially transparent OLED device which is easy to produce, because the opaque cathode layer 7 has been made of a standard and thus comparatively cheap and easy-to use material, namely an aluminium film.

Figure 2:
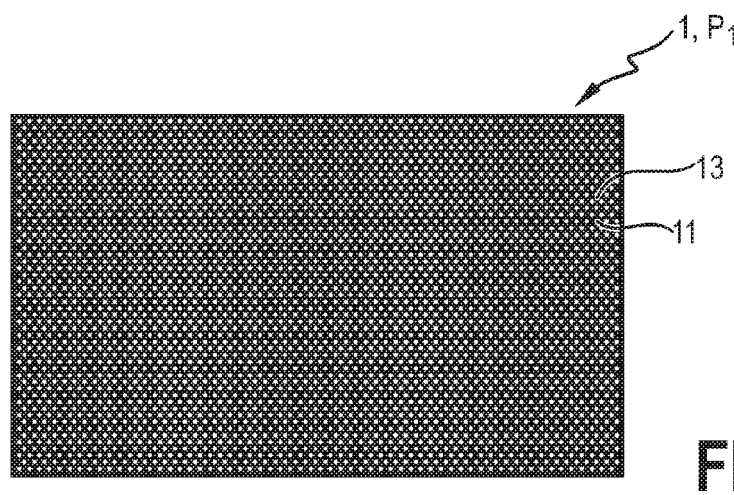
FIG. 2 shows a first example of a pattern of the cathode layer of the OLED device according to FIG. 1.

FIG. 2 shows the first example of a pattern $P_1$ of the cathode layer 7 seen from the emission surface E of the OLED device 1. Here it can be seen, that the cathode layer 7 comprises rather tiny and round-shaped (in fact: circular) cathode-free regions aligned in a regular pattern and surrounded by one integral cathode region 13 which thus can be contacted virtually at any spot in order to provide an overall electric contact.

Figure 3:
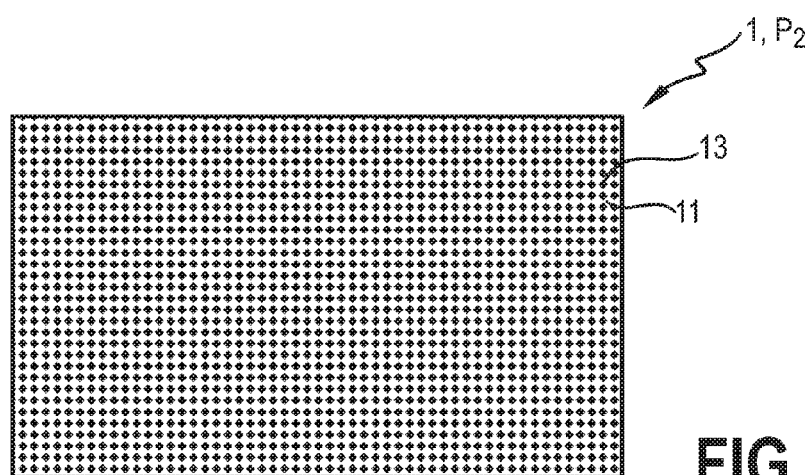
FIG. 3 shows a second example of a pattern of the cathode layer of the OLED device according to FIG. 1.

FIG. 3 shows a second example of a pattern $P_2$ of the cathode layer 7 seen from the emissions surface E of the OLED device 1. Here, cathode-free regions 13 and cathode regions 11 are equally sized squares aligned along each other in a kind of chessboard pattern. Again, due to the contacts between the single squares of the cathode regions 11 at their end tips which meet each other, the cathode regions 11 is one integral region and can thus be contacted again at any spot.

Figure 4:
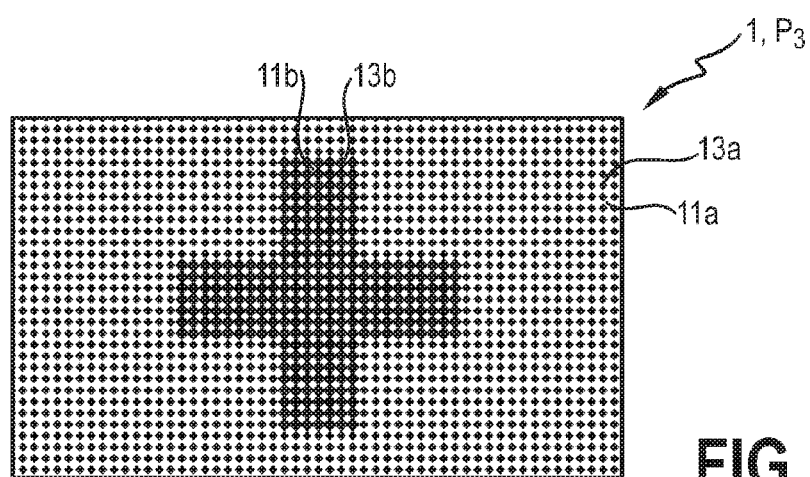
FIG. 4 shows a third example of a pattern of the cathode layer of the OLED device according to FIG. 1 which is also realized to comprise a first example of a figurative element.

FIG. 4 shows a third example of a pattern $P_3$ of the cathode layer 7 seen from the emission surface E of the OLED device 1. It is essentially made up with the pattern $P_2$ as shown in FIG. 3, with first cathode-free regions 13a and first cathode regions 11a which are the same as in the pattern $P_2$. However, in a middle area, a figurative element depicting a cross is realized by a slightly different pattern of second cathode-free regions 13b and second cathode regions 11b, whereby the latter are larger than the first cathode regions 11a and the former are smaller in size than the first cathode-free regions 13a. The visual effect is that the cross as a figurative element can be observed although its outer limits are not really explicitly outlined.

Figure 5:
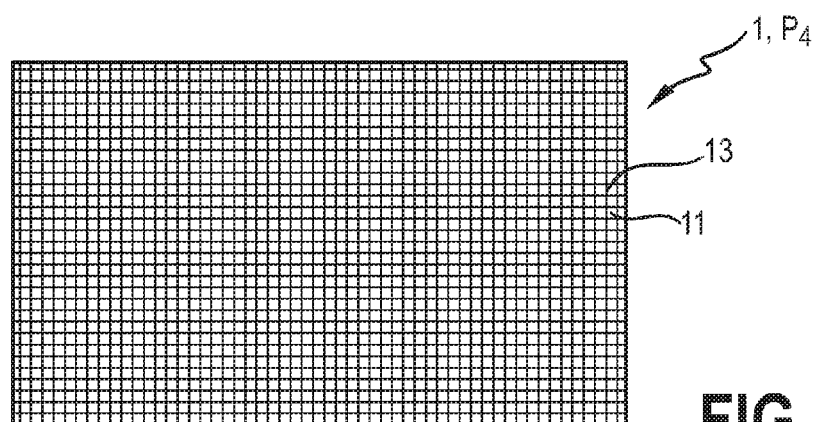
FIG. 5 shows fourth example of a pattern of the cathode layer of the OLED device according to FIG. 1.

FIG. 5 shows a fourth example of a pattern $P_3$ of the cathode layer 7 from the emission surface E of the OLED device 1. Here, the majority of space in the region of the cathode layer 7 is cathode-free regions 13. The cathode region 11 is only a grid pattern which is regularly shaped. Nevertheless, it can be contacted at any spot once again as the grid pattern provides for an integral cathode region 11 once again.

Figure 6:
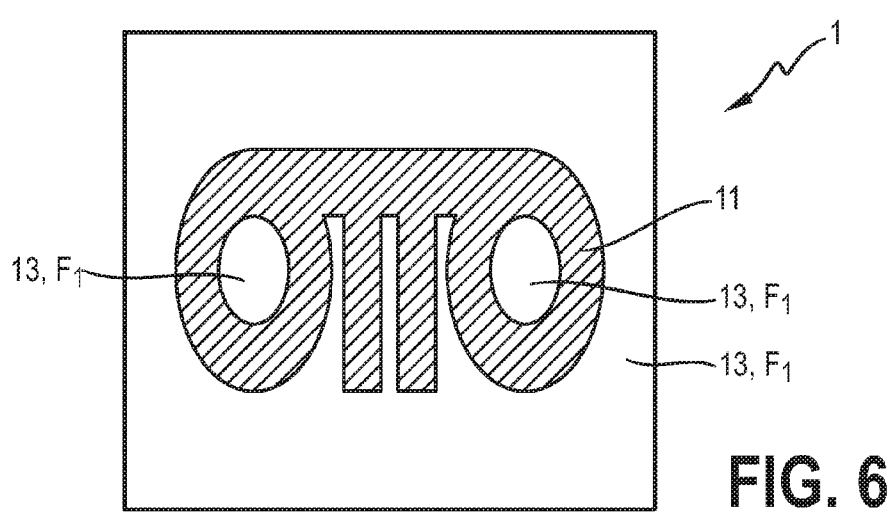
FIG. 6 shows a second example of the cathode layer of the OLED device according to FIG. 1 realized to comprise a figurative element.

FIG. 6 shows a second example of the cathode layer 7 of the OLED device comprising a figurative element $F_1$. Here, the name "Otto", i.e. a combination of letters, or generally codes, is depicted as a figurative element $F_1$. The figurative element $F_1$ is made up by the cathode region 11, whereas the holes inside of the O's and the surrounding part of the display region of the OLED device 1 is made of a cathode-free region 13. This means that the figurative element $F_1$ can also be seen when the OLED device 1 is switched off and when the OLED device 1 is switched on.

Figure 7:
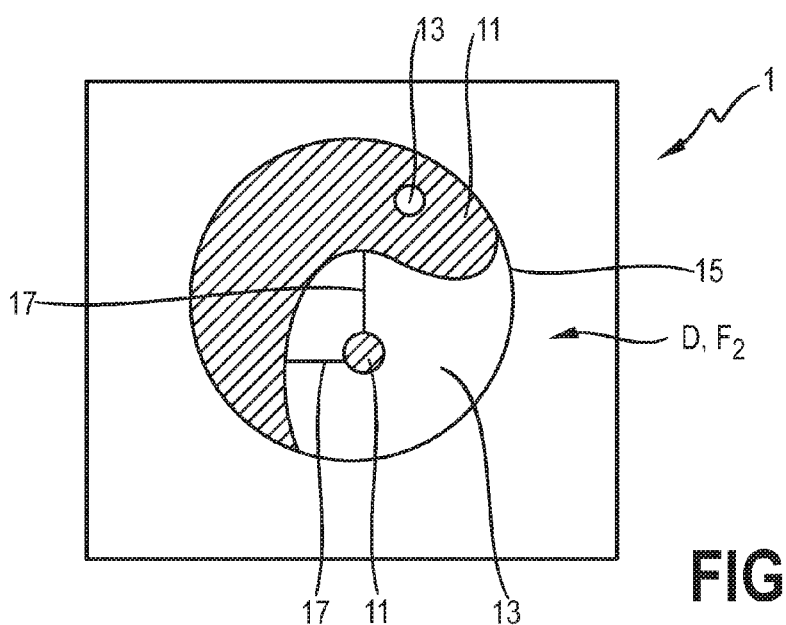
FIG. 7 shows a third example of the cathode layer of the OLED device according to FIG. 1 realized to comprise a figurative element.

FIG. 7 shows a third example of the cathode layer 7 of the OLED device 1 comprising a figurative element $F_2$. In this context, there can also be described the definition of a display region D. The figurative element $F_2$ is a yin and yang sign bounded by a surrounding circle 15. This surrounding circle 15 defines the boundaries of the display region D of the OLED device 1. The yin and yang sign comprises holes in the middle of a particular fish-like shape. One cathode-free region 13 constitutes the hole within a fish-like shaped cathode region 11, whereas the second cathode region 11 constitutes the hole within a fish-like shaped cathode-free region 13. In order to contact both cathode regions 11 at the same time with one contact, two conductive traces 17 of conductive material interconnect these two cathode regions 11, so that they both can emit light based on just one contact. These conductive traces 17 are transparent traces 17 so that an observer cannot see them either during switch-off or during operation of the OLED device 1.

Figure 8:
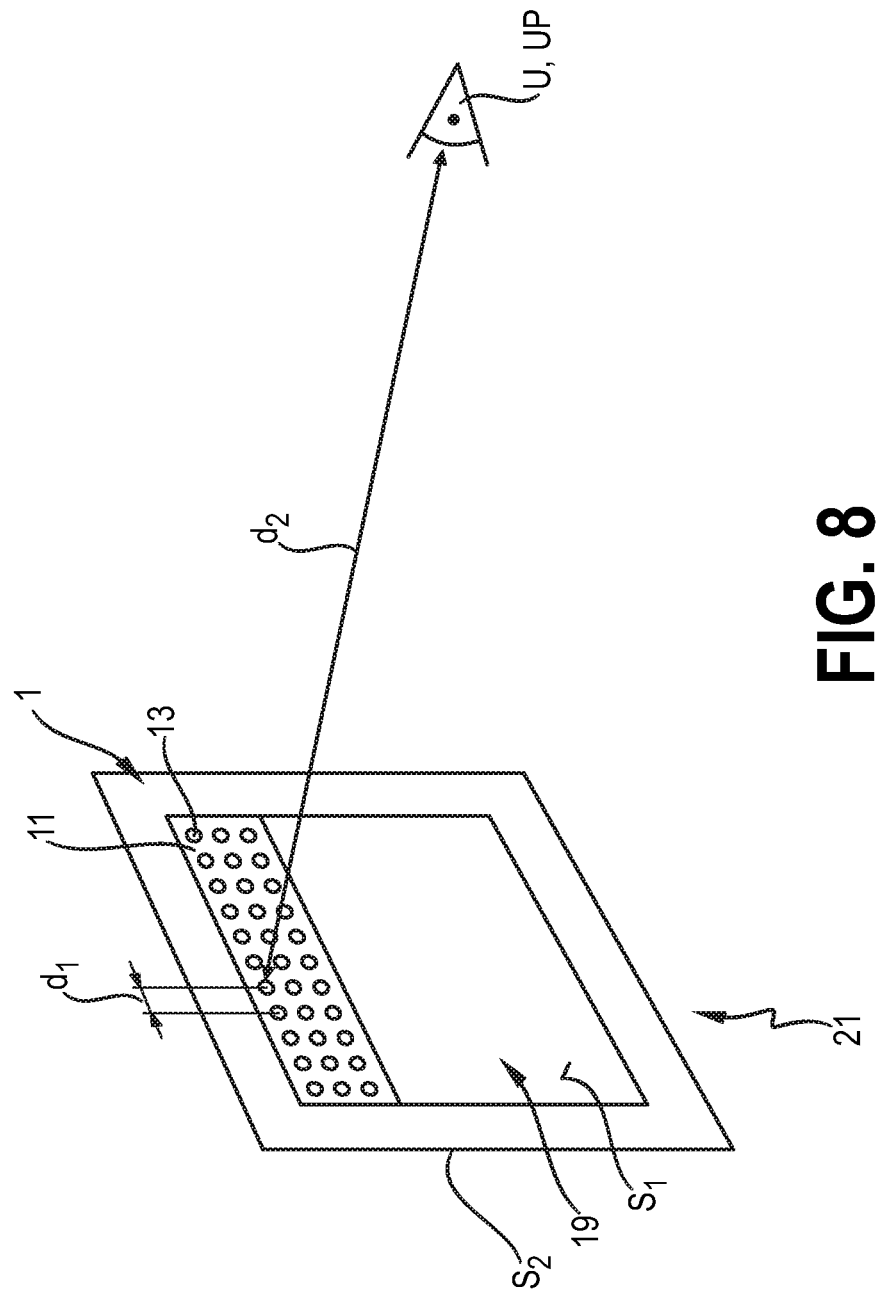
FIG. 8 shows an application constellation of an embodiment of an OLED device according to the invention.

FIG. 8 shows a particular application constellation of an embodiment of the OLED device 1. An OLED device 1 which is realized by using the pattern $P_1$ shown in FIG. 2 is attached to a window pane 19 of a window 21. The anode layer 5 faces into the direction of a first surface $S_1$ of the window pane 19 directed towards an observer U who looks at the window 21 from a predefined user position UP at a predefined distance $d_2$ from the window 21. Therefore, the cathode layer 7 faces into the opposite direction, i.e. into the direction of a second surface $S_2$ at the opposite side of the first surface $S_1$. The pattern $P_1$ of the OLED device one is realized such that the cathode-free regions 13 are at an equal distance $d_1$ from each other. This distance $d_1$ is defined in dependence of the predefined distance $d_2$ of the observer U at his predefined user position UP. The distance $d_1$ is chosen such that in the observer U will in operation of the OLED device 1 not be able to distinguish between the cathode region 11 and the cathode-free region 13. Therefore a kind of blurr effect occurs which gives the overall impression to the observer U that he is confronted with a light-emitting source which emits light over the entirety of its plane.

Although the present invention has been disclosed in the form of preferred embodiments and variations thereon, it will be understood that numerous additional modifications and variations could be made thereto without departing from the scope of the invention. For example, the patterns and shapes of the cathode regions constitute a selection out of a huge variety of possibilities. Further, apart from the layers shown in FIG. 1, an OLED device according to the invention may comprise one or more additional functional or design layers.

For the sake of clarity, it is to be understood that the use of "a" or "an" throughout this application does not exclude a plurality, and "comprising" does not exclude other steps or elements.

The invention claimed is:

1. An OLED device comprising:
    an organic layer configured to emit light;
    an essentially transparent anode layer; and
    an essentially opaque cathode layer, the essentially opaque cathode layer comprising:
        at least one cathode region;
        a plurality of cathode-free regions, wherein the cathode-free regions are arranged be essentially transparent in the direction of a cross extension of the OLED device,
    wherein the organic layer is disposed between the essentially transparent anode layer and the essentially opaque cathode layer,
    wherein the essentially opaque cathode layer is arranged along a main extension plane of the OLED device
    wherein the at least one cathode region comprises a display region,
    wherein the plurality of cathode-free regions comprise a non-display region,
    wherein light emission only takes place from the display region and not from the non-display region, and
    wherein the plurality of cathode-free regions is larger than the at least one cathode region.

2. The OLED device according to claim 1, comprising a pattern of cathode-free regions.

3. The OLED device according to claim 2, wherein the pattern is a repetitive pattern with respect to at least one direction along the main extension plane.

4. The OLED device according to claim 1, wherein the at least one cathode region is arranged to form a depiction of a figurative element.

5. The OLED device according to claim 4, wherein the essentially transparent anode layer is applied to an essentially transparent substrate.

6. The OLED device according to claim 5,
wherein the organic layer has a at least one side surface,
wherein the essentially opaque cathode layer is arranged to reflect light coming from the side surface of the organic layer.

7. The OLED device according to claim 1, wherein the essentially opaque cathode layer comprises a metal.

8. The OLED device according to claim 1, whereby a pitch of the cathode-free regions are arranged to be less than a minimum resolution perceivable by an eye of an observer at a predefined position relative to the OLED device.

9. The OLED device according to claim 1,
wherein the OLED device is transparent,
and wherein the OLED device only emits light in a single direction,
wherein the single direction is away from the essentially opaque cathode layer through the anode layer.

10. The OLED device according to claim 1, wherein the essentially opaque cathode layer comprises a cathode-free region of a larger extension.

11. OLED device according to claim 1 further comprising a plurality cathode regions, wherein at least two of the plurality of cathode regions are electrically connected by a conductive material.

12. A window pane with a first surface directed in an observer direction towards a designated observer and a second surface directed in a direction opposite the observer direction, wherein the window pane includes an OLED device comprising:
an organic layer configured to emit light;
an essentially transparent anode layer; and
an essentially opaque cathode layer, the essentially opaque cathode layer comprising:
at least one cathode region;
a plurality of cathode-free regions, wherein the cathode-free regions are arranged be essentially transparent in the direction of a cross extension of the OLED device,
wherein the organic layer is disposed between the essentially transparent anode layer and the essentially opaque cathode layer,
wherein the essentially opaque cathode layer is arranged along a main extension plane of the OLED device
wherein the at least one cathode region in which the essentially opaque cathode layer is present comprises a display region,
wherein the cathode-free regions comprise a non-display region,
wherein light emission only takes place from the display region and not from the non-display region,
wherein the plurality of cathode-free regions is larger than the at least one cathode region,
wherein the anode layer is arranged to face in the observer direction,
wherein the window pane is implemented in a window.

13. A method of producing an OLED device, the OLED device comprising an organic layer which emits light, the method comprising:
disposing the organic layer between an essentially transparent anode layer and an essentially opaque cathode layer,
arranging the essentially opaque cathode layer along a main extension plane of the OLED device, the essentially opaque cathode layer comprising:
at least one cathode region;
a plurality of cathode-free regions, wherein the cathode-free regions are arranged be essentially transparent in the direction of a cross extension of the OLED device,
wherein the at least one cathode region in which the essentially opaque cathode layer is present comprises a display region,
wherein the cathode-free regions comprise a non-display region,
wherein the plurality of cathode-free regions is larger than the at least one cathode region,
wherein light emission only takes place from the display region and not from the non-display region,
wherein at least a portion of the essentially opaque cathode layer is an integral layer of the OLED device,
wherein the integral layer is continuous,
wherein at least a portion of the cathode-free regions is formed as at least one opening in the integral layer,
wherein the at least one opening is surrounded by the integral layer.

14. The method according to claim 13, further comprising partially removing the essentially opaque cathode layer.

15. The method according to claim 14, wherein laser ablation is used to partially remove the essentially opaque cathode layer.

16. The method according to claim 14, wherein plasma etching is used to partially remove the essentially opaque cathode layer.

17. The method according to claim 13, further comprising interconnecting at least two cathode regions by a locally disposed transparent conductive material.

18. The OLED device according to claim 13, wherein the essentially opaque cathode layer comprises a cathode-free region of a larger extension.

* * * * *